(12) United States Patent
Hsieh et al.

(10) Patent No.: US 9,255,963 B2
(45) Date of Patent: Feb. 9, 2016

(54) BUILT-IN SELF-TEST CIRCUIT FOR VOLTAGE CONTROLLED OSCILLATOR

(71) Applicant: Taiwan Semiconductor Manufacturing Company, Ltd., Hsin-Chu (TW)

(72) Inventors: Hsieh-Hung Hsieh, Taipei (TW); Ming Hsien Tsai, New Taipei (TW); Tzu-Jin Yeh, Hsin-Chu (TW); Chewn-Pu Jou, Hsin-Chu (TW); Fu-Lung Hsueh, Kaohsiung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/252,886

(22) Filed: Apr. 15, 2014

(65) Prior Publication Data

US 2014/0225676 A1 Aug. 14, 2014

Related U.S. Application Data

(63) Continuation-in-part of application No. 13/103,571, filed on May 9, 2011, now Pat. No. 8,729,968.

(51) Int. Cl.
*H03B 5/12* (2006.01)
*G01R 31/28* (2006.01)
*H03L 5/00* (2006.01)

(52) U.S. Cl.
CPC ............ *G01R 31/2824* (2013.01); *H03L 5/00* (2013.01)

(58) Field of Classification Search
CPC ..................................................... H03B 5/1278
USPC ........................................... 331/109, 183, 44
See application file for complete search history.

(56) References Cited

U.S. PATENT DOCUMENTS

| | | | |
|---|---|---|---|
| 6,680,655 B2 * | 1/2004 | Rogers | ........................ 331/109 |
| 7,126,359 B2 | 10/2006 | Huang et al. | |
| 7,271,674 B1 | 9/2007 | Butenhoff et al. | |
| 2005/0138499 A1 | 6/2005 | Pileggi et al. | |
| 2006/0259836 A1 | 11/2006 | Liu | |
| 2008/0266011 A1 | 10/2008 | Kuosmanen | |
| 2008/0278247 A1 | 11/2008 | Wang et al. | |

FOREIGN PATENT DOCUMENTS

CN        101666833 A        3/2010

OTHER PUBLICATIONS

Ratni, et al., "RF Power Detector Using a Silicon MOSFET," Microwave Symposium Digest, IEEE MTT-S Digest, Jun. 7-12, 1998, pp. 1139-1142.

* cited by examiner

*Primary Examiner* — Joseph Chang
(74) *Attorney, Agent, or Firm* — Slater & Matsil, L.L.P.

(57) ABSTRACT

A device comprises a radio frequency peak detector configured to receive an ac signal from a voltage controlled oscillator and generate a dc value proportional to the ac signal at an output of the radio frequency peak detector and a feedback control unit coupled between an output of the radio frequency peak detector and an input of the voltage controlled oscillator.

20 Claims, 8 Drawing Sheets

BUILT-IN SELF-TEST CIRCUIT FOR VOLTAGE CONTROLLED OSCILLATOR

This application is a continuation-in-part of U.S. patent application Ser. No. 13/103,571, filed May 9, 2011, and entitled "Built-in Self-test Circuit for Voltage Controlled Oscillator," which application is hereby incorporated herein by reference.

BACKGROUND

In radio frequency circuits, such as a receiver or transceiver, a voltage controlled oscillator (VCO) is used as a frequency synthesizer to down-convert or up-convert a radio frequency signal. A VCO may comprise an oscillator designed to be controlled in frequency by a received voltage generated by a VCO control system formed by a frequency divider, a frequency and phase detector, a charge pump and a low pass filter. In the VCO control system, the output of the frequency divider is compared with a reference signal at the frequency and phase detector. The output of the frequency and phase detector is coupled to the low pass filter and further coupled to the oscillator. As a result, the oscillator generates a desired signal in response to the voltage from the low pass filter.

During the process of fabricating semiconductor chips, a plurality of VCO circuits may be built on a wafer. In order to detect defective voltage controlled oscillators of a wafer, various testing circuits are employed to test voltage controlled oscillators during different phases of fabricating semiconductor devices. There are two major types: semiconductor testing performed at wafer level and semiconductor testing performed at packaging level. An advantageous feature of wafer level testing is that wafer level product testing helps to reduce the cost of package and improve the yield.

Wafer level testing can be done by either using a probe card or built-in self-test circuits. A probe card may comprise a variety of probes. Each of the variety of probes may be coupled to a testing pad on a wafer to be tested. The probe card generates a testing signal and reads the testing results from the probes coupled to the testing pads on the wafer. If one circuit block on the wafer does not work or its result is out of the limit to which the circuit block is specified, the probe card can find the failure through the result from the probe coupled to the defective circuit block. By employing the probe card, defective circuit blocks can be found so that they are screened out before the wafer is sent to the next stage of a semiconductor fabrication process. As a result, the cost for packaging defective chips will be saved.

Built-in self-test circuits may be placed at regions wherein scribe lines are drawn. While conventional built-in self-test circuits may only test open-circuit, short-circuit and dc characteristics of an active device, conventional built-in self-test circuits may be not sufficient for evaluating a VCO because the ac characteristics of a VCO is a key factor to decide whether the radio frequency performance of the VCO is within the limit to which the VCO is specified. As a result, despite passing wafer level testing of open-circuit, short-circuit and dc characteristics, some VCO circuits may still fail to pass the final packaged chip test.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure will be described with respect to various embodiments in a specific context, a single transistor based peak detector converting the amplitude of an ac signal from a cross-coupled voltage controlled oscillator into a dc value. The disclosure may also be applied, however, to converting an ac signal's amplitude into a dc value by means of various peak detector topologies.

Figure 1:
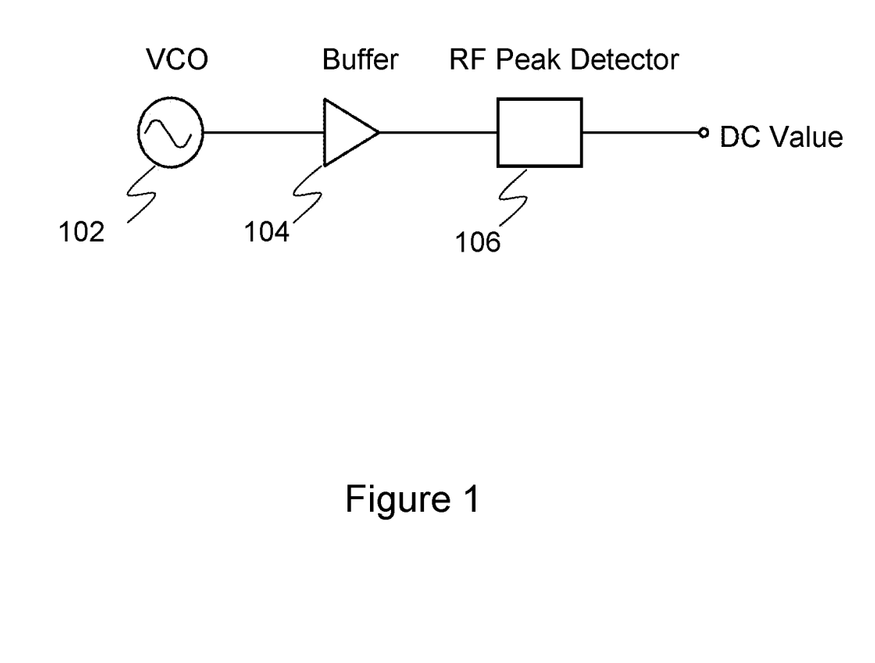
FIG. 1 illustrates a block diagram of a built-in self-test circuit for testing a voltage controlled oscillator in accordance with an embodiment.

Referring initially to FIG. 1, a block diagram of a built-in self-test circuit for testing a voltage controlled oscillator (VCO) is illustrated in accordance with an embodiment. In a wafer, there may be a plurality of VCO circuits such as VCO 102 illustrated in FIG. 1. In order to test the ac characteristics of the VCO 102, a radio frequency (RF) peak detector 106 is built, preferably in the same wafer, and coupled to the output of the VCO 102 via a buffer 104. The RF peak detector 106 is configured such that: when the VCO 102 generates an ac signal, the RF peak detector 106 detects the amplitude of the ac signal and generates a dc output proportional to the amplitude of the ac signal. The detailed operation of the RF peak detector 106 will be described below with respect to FIG. 2. On the other hand, when the VCO 102 fails to generate an ac signal, the output of the RF peak detector 106 is at zero volts. An advantageous feature of having an on-chip self-test RF peak detector is that the failed VCO can be identified before packaging so as to reduce unnecessary time and cost in the subsequent steps of a semiconductor fabrication process.

Figure 2:
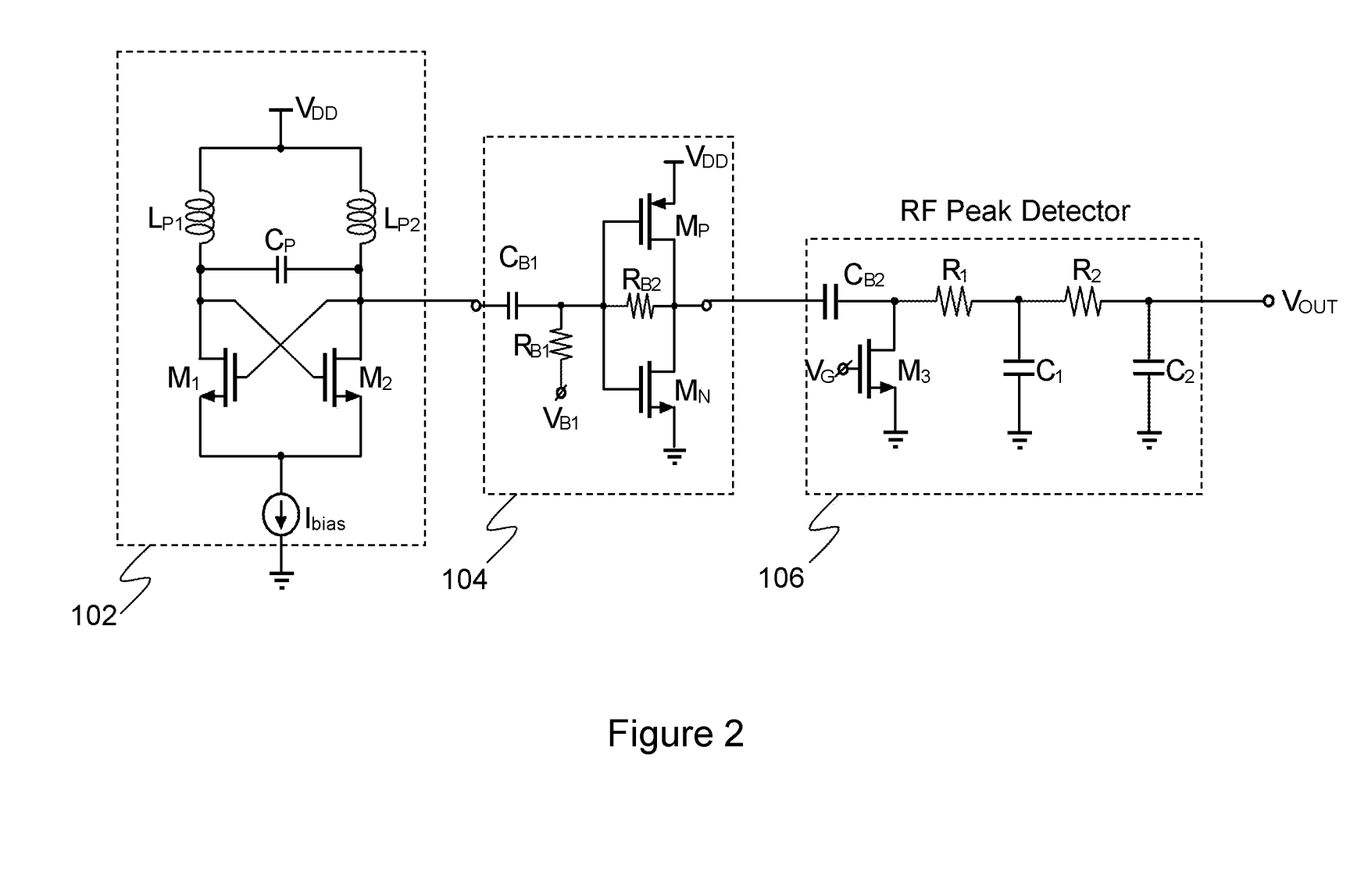
FIG. 2 illustrates in detail a schematic diagram of the built-in self-test circuit shown in FIG. 1.

FIG. 2 illustrates in detail a schematic diagram of the built-in self test circuit shown in FIG. 1. In accordance with an embodiment, a cross-coupled VCO is used to illustrate the inventive aspects of the various embodiments. The cross-coupled VCO 102 comprises a first inductor $L_{P1}$, a second inductor $L_{P2}$, a capacitor $C_P$, a pair of n-channel metal oxide semiconductor (NMOS) transistors M1 and M2 and a bias current source $I_{bias}$. Both the first inductor $L_{P1}$ and the second inductor $L_{P2}$ are coupled to a voltage potential VDD at one terminal and coupled to the capacitor $C_P$ at the other terminal. The L-C tank formed by the first inductor $L_{P1}$, the second inductor $L_{P2}$ and the capacitor $C_P$ are further coupled to the pair of NMOS transistors M1 and M2. It should be noted that the inductors $L_{P1}$, $L_{P2}$ and the capacitor $C_P$ may be derived from inductive effects of a square area from a wafer such as a square spiral inductor and capacitive effects of a NMOS transistor respectively.

The NMOS transistor M1 and the NMOS transistor M2 are cross-coupled to opposite terminals. More particularly, the gate of the NMOS transistor M1 is coupled to the drain of the NMOS transistor M2 and the gate of the NMOS transistor M2 is coupled to the drain of the NMOS transistor M1. As shown in FIG. 2, the drains of both NMOS transistors M1 and M2 are further coupled to the L-C tank formed by inductors $L_{P1}$, $L_{P2}$ and capacitor $C_P$. The sources of both NMOS transistor M1 and M2 are connected together and coupled to ground via the bias current source $I_{bis}$. As known in the art, the cross-coupled VCO 102 is capable of having a wider tuning range by fine-tuning the value of the capacitor $C_P$. The operation principle of a cross-coupled VCO is well-known in the art, and thus is not discussed herein.

The buffer 104 comprises a p-channel metal oxide semiconductor (PMOS) transistor $M_P$ and an NMOS transistor $M_N$ connected in series. More particularly, the source of the PMOS transistor $M_P$ is connected to the voltage potential VDD and the drain of the PMOS transistor $M_P$ is coupled to the drain of the NMOS transistor $M_N$. The gates of the PMOS transistor $M_P$ and the NMOS transistor $M_N$ are connected together and further coupled to the output of the cross-coupled VCO 102 via a first blocking capacitor $C_{B1}$. The buffer further comprises two bias resistors $R_{B1}$ and $R_{B2}$. The first bias resistor $R_{B1}$ is connected from a bias voltage potential $V_{B1}$ to the gates of $M_P$ and $M_N$. The second bias resistor $R_{B2}$ is connected between the gates and drains of both transistors $M_P$ and $M_N$. The buffer 104 is used to isolate the cross-coupled VCO 102 and the RF peak detector 106 so as to prevent the RF peak detector 106 from interfering with the operation of the cross-coupled VCO 102. The operation principle of the buffer shown in FIG. 2 is well-known in the art, and thus is not discussed herein. However, it should be noted that the buffer shows in FIG. 2 can be replaced by any circuits capable of isolating the VCO 102 from the RF peak detector 106. For example, the isolation between the VCO 102 and the RF peak detector 106 can be implemented by adding a differential pair between the VCO 102 and the RF peak detector 106.

The RF peak detector 106 comprises an NMOS transistor M3 operating at a weak inversion region, a second block capacitor $C_{B2}$, a first filter and a second filter. It should be noted while FIG. 2 illustrates a RF peak detector employing an NMOS transistor operating at a weak inversion region, the RF peak detector shown in FIG. 2 is merely an example, which should not unduly limit the scope of the claims. One of ordinary skill in the art would recognize many variations, alternatives, and modifications. For example, the NMOS transistor may be replaced by a PMOS transistor operating at a weak inversion region. Furthermore, the RF peak detector 106 can be replaced by any circuits capable of converting an amplitude of an ac signal into a dc value. It should further be noted that while FIG. 2 illustrates two filters connected in cascade, a single filter may fulfill the function of eliminating high frequency unwanted signals and generating a dc value at the output of the RF peak detector 106.

While there may be many ways of implementing a RF peak detector, when the RF peak detector is implemented on a wafer, there is a need for simplification as well as performance. As a result, a simple peak detector topology is preferred. The RF peak detector 106 is formed by a single NMOS transistor, and thus is a preferred embodiment for implementing the built-in self-test circuit for a VCO. The NMOS transistor M3 has a gate coupled to a fixed voltage $V_G$, which is small enough so that the NMOS transistor M3 is biased to operate in a weak inversion region. As known in the art, the drain current of a NMOS transistor operating in a weak inversion region can be expressed by an exponential function as follows:

$$I_D = \frac{W}{L} I_{D0} \cdot e^{qV_{GS}/nkT} \cdot (1 - e^{-qV_{DS}/kT})$$

Where W, L, $I_{D0}$, q, nkT are constants for an NMOS transistor. Because the gate-to-source voltage of the NMOS transistor is fixed, the equation above can be further simplified into the following equation:

$$I_D = K_1 (1 - e^{K_2 V_{DS}})$$

Where K1 and K2 are constants. In accordance with the Taylor series approximation, the drain current can be simplified by replacing the exponential function with the first three terms of the Taylor series. As a consequence, the drain current can be expressed as:

$$I_D = K_1 \cdot \left( K_2 \cdot V_{DS} + \frac{1}{2} \cdot K_2^2 \cdot V_{DS}^2 \right)$$

Where $V_{DS}$ is generated from the output of the VCO 102. Use a cosine function to replace $V_{DS}$. The equation above can be expressed as:

$$I_D = K_1 \cdot K_2 \cdot \cos(\omega X) + \frac{1}{4} \cdot K_1 \cdot K_2^2 \cdot (1 + \cos(2\omega X))$$

From the equation above, the drain current comprises a dc component as well as an ac component proportional to the amplitude of the input signal generated from the VCO 102. As a result, the NMOS transistor M3 operating at a weak inversion region can convert an ac input signal into a dc component and an ac component proportional to the signal generated by the VCO 102. It should be noted while FIG. 1 illustrates an NMOS transistor operating at a weak inversion region, the RF peak detector can also be implemented by a PMOS transistor operating at a weak inversion region. As known in the art, the operation of a PMOS transistor operating at a weak inversion region will not be discussed herein to avoid repetition.

FIG. 2 further illustrates a first filter formed by R1 and C1 and a second filter formed by R2 and C2. Both filters have a cut-off frequency much lower than the frequency of the ac signal generated from the VCO 102. As a result, the high frequency ac components at the output of the NMOS transistor M3 are eliminated and the dc component can pass through both filters and reach the output of the RF peak detector 106. An advantageous feature of having an NMOS transistor operating at a weak inversion region is that a dc component proportional to the amplitude of the output of the VCO can be forwarded to the output of the RF peak detector 106 and unwanted ac components are eliminated by the low pass filters shown in FIG. 2.

Figure 3A:
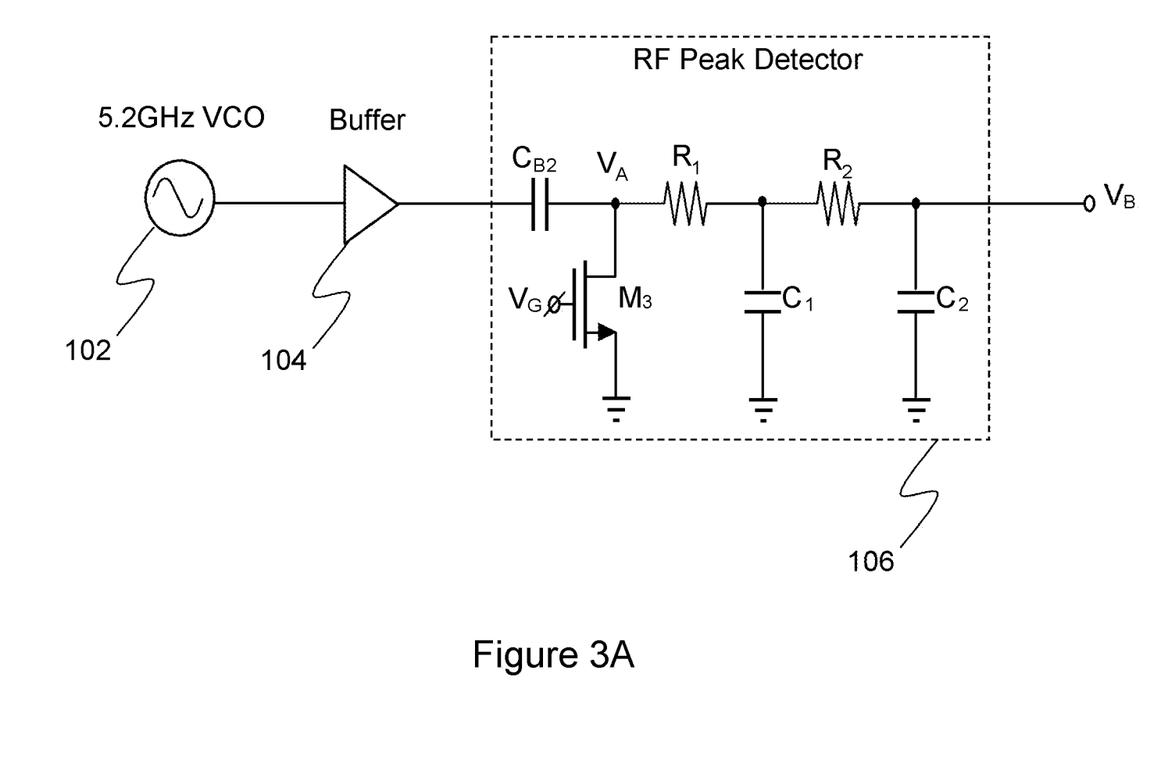
FIGS. 3A-3C illustrate a built-in self-test circuit for testing a VCO generating a 5.2 GHz signal.
Figure 3B:
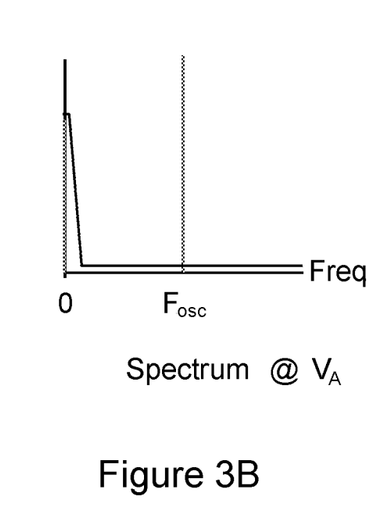
Figure 3C:
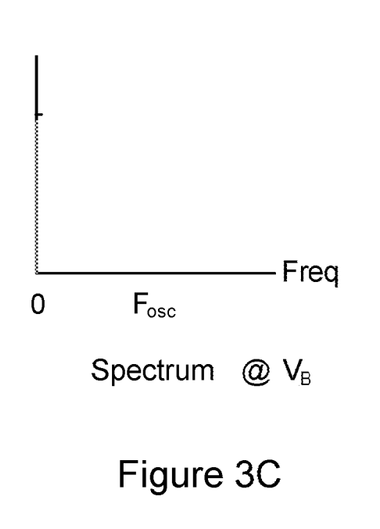

FIG. 3A shows a built-in self-test circuit for testing a VCO generating a 5.2 GHz signal. When the VCO 102 functions correctly and generates a 5.2 GHz signal, as shown in FIG. 3B, the spectrum at $V_A$ of the RF peak detector 106 includes a dc component and an ac component at 5.2 GHz. Furthermore, the first filter and second filter eliminate the high frequency ac component. As shown in FIG. 3C, the spectrum at $V_B$ includes only a dc component proportional to the amplitude of the 5.2 GHz signal generated by the VCO 102.

Figure 4A:
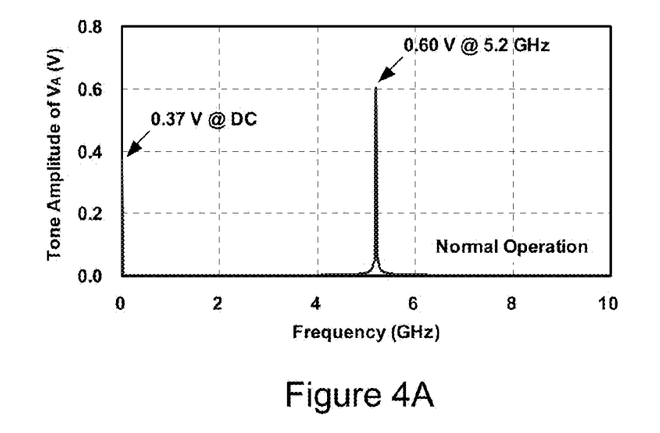
FIGS. 4A-4C illustrate in detail a simulation result of the built-in self-test circuit shown in FIG. 3A.
Figure 4B:
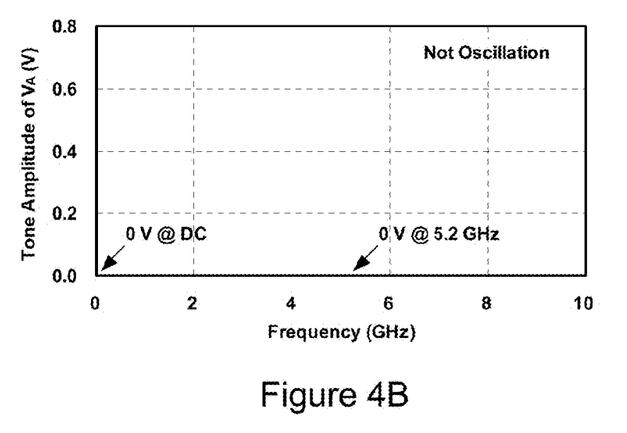
Figure 4C:
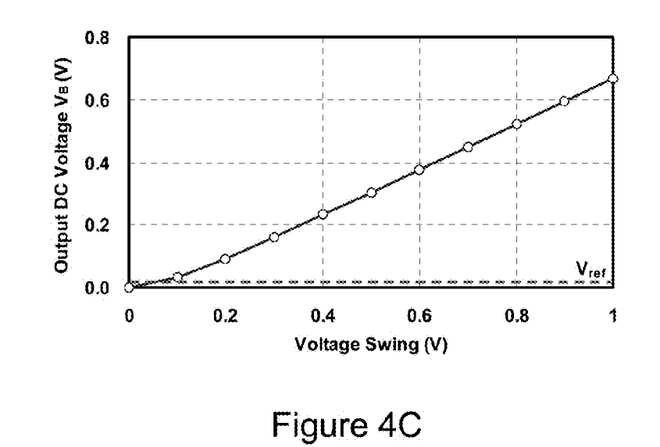

FIGS. 4A-4C illustrate in detail a simulation result of the built-in self-test circuit shown in FIG. 3A. In accordance with an embodiment, when the VCO 102 is in a normal operation mode generating a 5.2 GHz ac signal, the simulation result shows at $V_A$ the dc component has a voltage potential of 0.37V and the ac component at 5.2 GHz has a amplitude of 0.60V. In contrast, when the VCO 102 fails to generate an ac signal at 5.2 GHz, FIG. 4B shows both the dc component and the ac component at 5.2 GHz are at zero volts. FIG. 4C further gives a relationship curve between the amplitude of the ac signal generated by the VCO 102 and the dc component's value at the output of the RF peak detector 106. For example, when the VCO 102 generates an ac signal having an amplitude of 0.6V, the corresponding dc value at the output of the RF peak detector 106 is 0.4V. The curve in FIG. 4C shows another advantageous feature of the RF peak detector is that the amplitude of an ac signal generated by the VCO 102 can be back-calculated based upon the dc value at the output of the RF peak detector 106.

Figure 5:
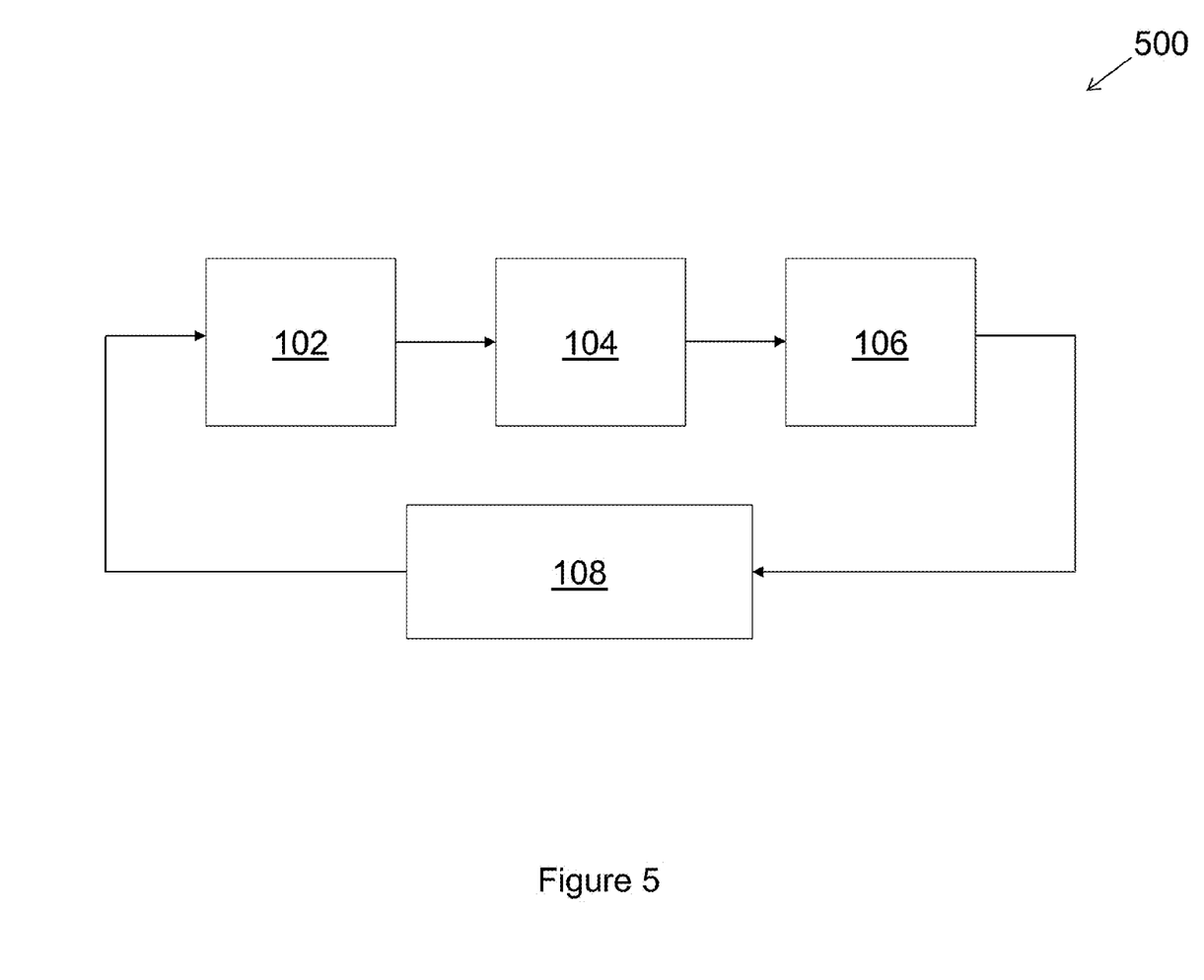
FIG. 5 illustrates a block diagram of a voltage controlled oscillator system in accordance with various embodiments of the present disclosure.

FIG. 5 illustrates a block diagram of a voltage controlled oscillator system in accordance with various embodiments of the present disclosure. The voltage controlled oscillator system 500 comprises a voltage controlled oscillator 102, a buffer 104, a RF peak detector 106 and a feedback control unit 108. As shown in FIG. 5, the voltage controlled oscillator 102, the buffer 104 and the RF peak detector 106 are connected in cascade. The feedback control unit 108 detects an output voltage of the RF peak detector 106 and generates a control signal based upon the detected voltage signal. The control signal is sent to the voltage controlled oscillator 102. The control signal is used to adjust a bias current of the voltage controlled oscillator 102 so that the output voltage of the RF peak detector 106 is within a predetermined range. The detailed operation principle of the feedback control unit 108 will be described below with respect to FIG. 6.

Figure 6:
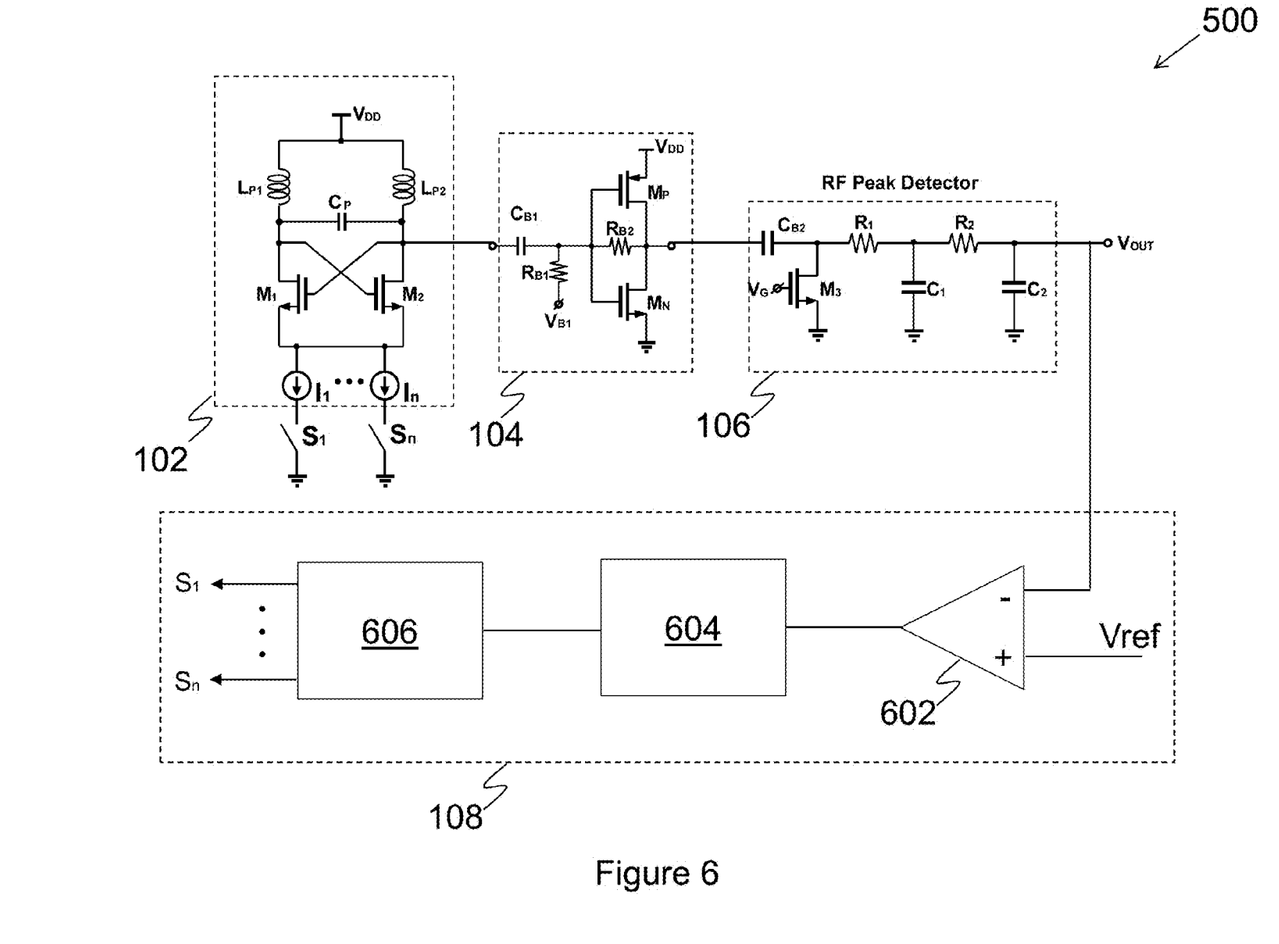
FIG. 6 illustrates a schematic diagram of the voltage controlled oscillator system shown in FIG. 5 in accordance with various embodiments of the present disclosure.

FIG. 6 illustrates a schematic diagram of the voltage controlled oscillator system shown in FIG. 5 in accordance with various embodiments of the present disclosure. The detailed structures of the voltage controlled oscillator 102, the buffer 104 and the RF peak detector 106 have described above with respect to FIG. 2, hence are not discussed in detail herein to avoid repetition.

It should be noted that the bias current source shown in FIG. 2 may comprise a plurality controllable current sources. As shown in FIG. 6, the controllable current sources $I_1$ to $I_n$ are connected in parallel. Each controllable current source (e.g., controllable current source $I_1$) is formed by a current source (e.g., $I_1$) and a switch (e.g., $S_1$). The current source and the switch are connected in series as shown in FIG. 6.

In some embodiments, the controllable current sources shown in FIG. 6 are binary-weighted current sources. In other words, the controllable current sources $I_1$, $I_2$, $I_3$, ... $I_n$ may provide currents I, 2I, 4I, ... $2^n \cdot I$ respectively.

The feedback control unit 108 comprises a comparator 602, a compensation network 604 and a driver 606. The comparator 602 is coupled to the output of the RF peak detector 106 and senses the voltage across the output terminals of the RF peak detector 106. The comparator 602 is configured to receive a predetermined reference signal Vref at a first input and a detected voltage signal at a second input. Based upon such two input signals, the comparator 602 generates a control signal to control the bias current source of the voltage controlled oscillator 102 accordingly.

The driver 606 converts the control signal into a plurality of gate drive signals for controlling the switches S1 to Sn. In some embodiments, when the reference signal Vref is greater than the detected voltage signal, the driver 606 turns on at least one more controllable current source so that the output voltage of the RF peak detector 106 is increased accordingly. On the other hand, when the detected voltage signal is greater than the reference signal Vref, the driver 606 turns off at least one more controllable current source so that the output voltage of the RF peak detector 106 is reduced accordingly.

In some embodiments, during a swing calibration process of the voltage controlled oscillator 102, the feedback control unit 108 is employed to fine-tune the voltage controlled oscillator 102. More particularly, when the voltage controlled oscillator 102 oscillates, the comparator 602 determines whether the output voltage of the voltage controlled oscillator 102 is at a predetermined output voltage value or within a predetermined output voltage range. The predetermined output voltage value is represented by the reference voltage Vref as shown in FIG. 6.

In some embodiments, when the output voltage of the voltage controlled oscillator 102 is insufficient, the comparator 602 detects the insufficient output voltage through comparing the output voltage of the RF peak detector 106 with the reference voltage Vref. The bias current of the voltage controlled oscillator 102 will be increased until the output voltage of the RF peak detector 106 satisfies the predetermined output voltage value.

On the other hand, when the output voltage of the voltage controlled oscillator 102 is greater than a voltage to which the voltage controlled oscillator 102 is specified, the comparator 602 detects such an output voltage through comparing the output voltage of the RF peak detector 106 with the reference voltage Vref. The bias current of the voltage controlled oscillator 102 will be reduced until the output voltage of the RF peak detector 106 satisfies the predetermined output voltage value.

One advantageous feature of having the feedback control unit 108 is that, during a calibration process of the voltage controlled oscillator 102, the characteristics of the voltage controlled oscillator 102 may be fine-tuned through adjusting the bias current of the voltage controlled oscillator 102.

The compensation network 604 is used to place compensation poles and zeros so that the loop response of the voltage controlled oscillator system 500 can be controlled. In other words, the compensation network 604 is capable of compensating the control loop by dynamically adjusting its coefficients so that compensation zeros and poles can be adjusted accordingly. An advantageous feature of compensation network 604 is that the control loop can be tuned in response to different operating conditions so that the control loop can provide a stable system as well as a fast transient response.

It should be noted the diagram shown in FIG. 6 is merely an example, which should not unduly limit the scope of the claims. One of ordinary skill in the art would recognize many variations, alternatives, and modifications. For example, the compensation network 604 may be optional depending on different design needs and applications.

In some embodiments, the feedback control unit 108 may be implemented as a digital controller. The digital controller may receive a reference signal Vref from an external register. Alternatively, the reference signal Vref may be a dynamic system configuration adjustment signal from a user or a system management unit. Based upon the reference signal Vref and the detected voltage signal, the digital controller generates a plurality of gate drive signals for controlling the controllable bias current sources I1 to In.

An advantageous feature of the digital controller is that the digital controller can be configured to dynamically adjust control loop compensation parameters. Moreover, a dynamic adjustment through a digital controller may make dynamic compensation against process variations possible.

It should be noted that the feedback control unit 108 can be performed either in hardware or software or some combination thereof. In accordance with some embodiments, the feedback control function may be performed by a process such as executing a computer program on a digital signal processor or a central processing unit in accordance with code such as computer program code or software.

Figure 7:
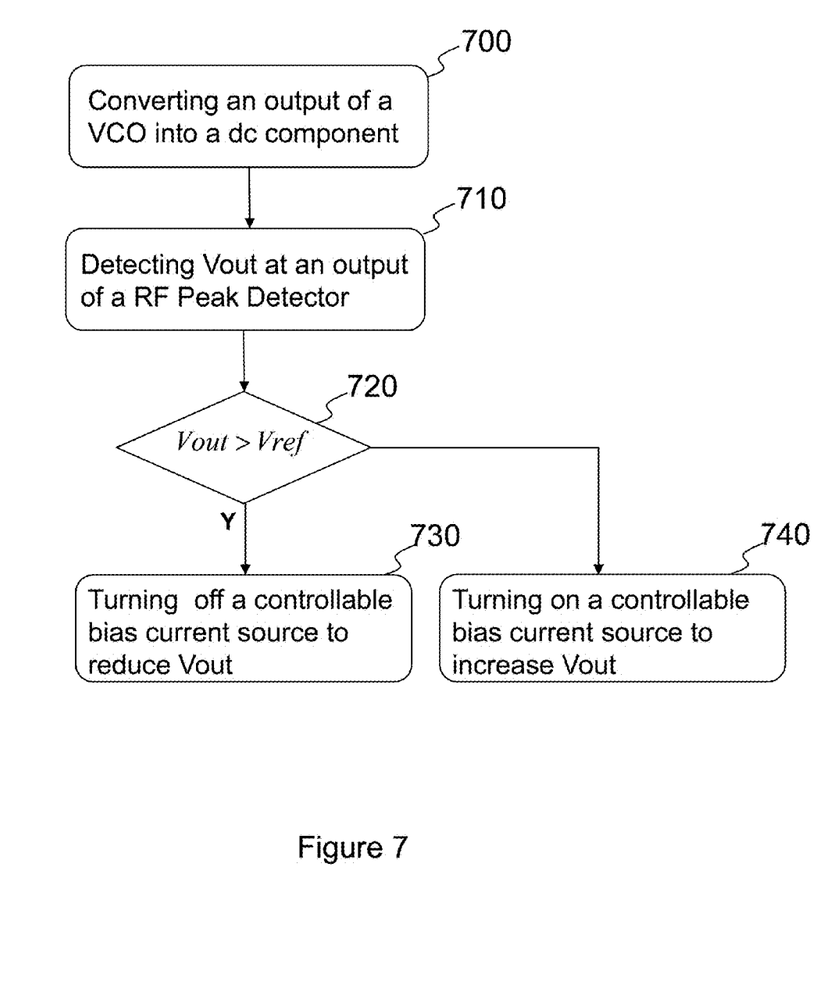
FIG. 7 illustrates a flow chart of calibrating a voltage controlled oscillator in accordance with various embodiments of the present disclosure.

FIG. 7 illustrates a flow chart of calibrating a voltage controlled oscillator in accordance with various embodiments of the present disclosure. At step 700, a RF peak detector converts an output of a voltage controlled oscillator into a dc component at the output of the RF peak detector. The dc component is proportional to the amplitude of the output voltage of the voltage controlled oscillator. The dc component is alternatively referred to as Vout throughout the description. At step 710, a first input of a comparator of a feedback control unit is employed to detect the dc component Vout. A second input of the comparator receives a predetermined reference signal Vref.

At step 720, if Vout>Vref, then the feedback control unit executes step 730 wherein the feedback control unit turns off a controllable bias current source to reduce Vout. On the other hand, if Vout<Vref, the feedback control unit executes step 730 wherein the feedback control unit turns on a controllable bias current source to increase Vout.

It should be noted that the feedback control unit may keep adjusting the bias current of the voltage controlled oscillator until Vout falls into a predetermined range or stays at a value to which it is specified.

In accordance with an embodiment, a circuit comprises a radio frequency peak detector configured to receive an ac signal from a voltage controlled oscillator and generate a dc value proportional to the ac signal at an output of the radio frequency peak detector and a feedback control unit coupled between an output of the radio frequency peak detector and an input of the voltage controlled oscillator.

In accordance with an embodiment, a system comprises a voltage controlled oscillator having a plurality of controllable bias current sources, a radio frequency peak detector configured to receive an ac signal from the voltage controlled oscillator and generate a dc value proportional to the ac signal at an output of the radio frequency peak detector and a feedback control unit coupled between an output of the radio frequency peak detector and an input of the voltage controlled oscillator, wherein the feedback control unit comprises a comparator and a driver connected in series.

In accordance with an embodiment, a method comprises receiving an ac signal from a voltage controlled oscillator, wherein the voltage controlled oscillator comprises a plurality of controllable bias current sources, detecting a peak value of the ac signal and converting the peak value into a dc value at an output of a radio frequency peak detector.

The method further comprises detecting a voltage across two terminals of the radio frequency peak detector and converting the voltage to a voltage sense signal, comparing the voltage sense signal with a reference signal, generating a plurality of gate drive signals based upon a comparison result generated in the comparing the voltage sense signal with the reference signal and sending the a plurality of gate drive signals to respective controllable bias current sources.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a radio frequency peak detector configured to receive an ac signal from a voltage controlled oscillator and generate a dc value proportional to the ac signal at an output of the radio frequency peak detector; and
   a feedback control unit coupled between an output of the radio frequency peak detector and an input of the voltage controlled oscillator, wherein the feedback control unit comprises:
      a comparator having a first input connected to the output of the radio frequency peak detector and a second input connected to a reference, and wherein the comparator is configured to compare the dc value with the reference;
      a compensation network having an input connected to an output of the comparator, and wherein the compensation network is configured to stabilize the feedback control unit; and
      a driver having an input connected to an output of the compensation network, wherein the driver is configured to adjust a bias current of the voltage controlled oscillator.

2. The circuit of claim 1, wherein the radio frequency peak detector comprises:
   an n-type metal oxide semiconductor (NMOS) transistor operating in a weak inversion region; and
   a first filter coupled between a drain terminal of the NMOS transistor and the output of the radio frequency peak detector, and wherein the first filter is configured such that a cut-off frequency of the first filter is less than a minimum frequency generated by the voltage controlled oscillator.

3. The circuit of claim 2, wherein:
   a gate of the NMOS transistor is coupled to a fixed voltage potential.

4. The circuit of claim 1, further comprising:
   a buffer placed between the radio frequency peak detector and the voltage controlled oscillator, wherein the buffer is configured to isolate the radio frequency peak detector from the voltage controlled oscillator.

5. The circuit of claim 1, wherein:
   the voltage controlled oscillator comprises a bias current source having a plurality of controllable current sources.

6. The circuit of claim 5, wherein:
each controllable current source of the plurality of controllable current sources comprises a current source and a switch;
the current source and the switch are connected in series; and
the switch is a transistor.

7. The circuit of claim 6, wherein:
a gate of the switch is coupled to the feedback control unit.

8. The circuit of claim 1, wherein:
the driver has an output coupled to a controllable current source of the voltage controlled oscillator.

9. A system comprising:
a voltage controlled oscillator having a plurality of controllable bias current sources;
a radio frequency peak detector configured to receive an ac signal from the voltage controlled oscillator and generate a dc value proportional to the ac signal at an output of the radio frequency peak detector, wherein the radio frequency peak detector comprises at least one R-C filter, and wherein the at least one R-C filter is configured to convert the ac signal into a dc signal; and
a feedback control unit coupled between an output of the radio frequency peak detector and an input of the voltage controlled oscillator, wherein the feedback control unit comprises a comparator and a driver connected in series.

10. The system of claim 9, wherein the voltage controlled oscillator is a cross-coupled oscillator comprising:
an L-C tank formed by a first inductor, a second inductor and a capacitor;
a cross-coupled transistor pair wherein a first transistor of the pair has a gate coupled to a drain of a second transistor of the pair and the second transistor has a gate coupled to a drain of the first transistor; and
the plurality of controllable bias current sources are connected in parallel and coupled between the cross-coupled transistor pair and ground.

11. The system of claim 9, further comprising:
a buffer placed between the radio frequency peak detector and the voltage controlled oscillator, wherein the buffer is configured to isolate the radio frequency peak detector from the voltage controlled oscillator.

12. The system of claim 9, wherein the radio frequency peak detector comprises:
an n-type metal oxide semiconductor (NMOS) transistor operating in a weak inversion region;
a first filter connected to a drain terminal of the NMOS transistor; and
a second filter coupled between the first filter and the output of the radio frequency peak detector.

13. The system of claim 9, further comprising:
a compensation network coupled between the comparator and the driver.

14. The system of claim 13, wherein the comparator comprises:
a first input configured to receive an output voltage signal of the radio frequency peak detector; and
a second input configured to receive a reference signal.

15. The system of claim 9, wherein the driver comprises:
a plurality of outputs coupled to respective controllable bias current sources.

16. A method comprising:
receiving an ac signal from a voltage controlled oscillator, wherein the voltage controlled oscillator comprises a plurality of controllable bias current sources;
detecting a peak value of the ac signal;
converting the peak value into a dc value at an output of a radio frequency peak detector, wherein the radio frequency peak detector comprises an n-type metal oxide semiconductor (NMOS) transistor operating in a weak inversion region, a first filter connected to a drain terminal of the NMOS transistor and a second filter coupled between the first filter and the output of the radio frequency peak detector;
detecting a voltage across two terminals of the radio frequency peak detector and converting the voltage to a voltage sense signal;
comparing the voltage sense signal with a reference signal;
generating a plurality of gate drive signals based upon a comparison result generated in the comparing the voltage sense signal with the reference signal; and
sending the a plurality of gate drive signals to respective controllable bias current sources.

17. The method of claim 16, further comprising:
connecting a gate of the NMOS transistor to a fixed voltage;
generating a dc component and an ac component at a drain of the NMOS transistor;
eliminating the ac component by employing a plurality of filters coupled between the drain of the NMOS transistor and the output of the radio frequency peak detector; and
generating a dc value proportional to an amplitude of the ac signal from the voltage controlled oscillator.

18. The method of claim 16, further comprising:
comparing the voltage sense signal with the reference signal through a comparator; and
generating the plurality of gate drive signals through a driver.

19. The method of claim 18, further comprising:
compensating a feedback control loop by adding a plurality of poles and zeros via a compensation network coupled between the comparator and the driver.

20. The method of claim 16, further comprising:
in response to a higher output voltage at the radio frequency peak detector, reducing a bias current of the voltage controlled oscillator; and
in response to a lower output voltage at the radio frequency peak detector, increasing the bias current of the voltage controlled oscillator.

* * * * *